United States Patent [19]
Simonsen

[11] Patent Number: 5,633,805
[45] Date of Patent: May 27, 1997

[54] LOGIC SYNTHESIS HAVING TWO-DIMENSIONAL SIZING PROGRESSION FOR SELECTING GATES FROM CELL LIBRARIES

[75] Inventor: Carl J. Simonsen, Aloha, Oreg.

[73] Assignee: Intel Corporation, Santa Clara, Calif.

[21] Appl. No.: 315,425

[22] Filed: Sep. 30, 1994

[51] Int. Cl.⁶ .................................................. G06F 15/00
[52] U.S. Cl. .................... 364/490; 364/488; 364/489; 364/491; 438/129; 438/599
[58] Field of Search ...................... 364/488, 489, 364/490, 491, 578; 327/564, 541, 581; 437/250, 51; 326/86, 33, 48, 56, 13; 365/230.01, 190, 195, 225.6, 230.06, 200; 395/500, 550, 183.09

[56] References Cited

U.S. PATENT DOCUMENTS

| | | | |
|---|---|---|---|
| 4,701,860 | 10/1987 | Mader | 364/488 |
| 5,077,676 | 12/1991 | Johnson et al. | 364/488 |
| 5,148,065 | 9/1992 | Krenik et al. | 364/490 |
| 5,406,497 | 4/1995 | Altheimer et al. | 364/489 |
| 5,416,718 | 5/1995 | Yamazaki | 364/488 |
| 5,422,317 | 6/1995 | Hua et al. | 437/250 |
| 5,426,591 | 6/1995 | Ginetti et al. | 364/489 |
| 5,432,707 | 7/1995 | Leung | 364/489 |
| 5,459,673 | 10/1995 | Carmean et al. | 364/489 |
| 5,477,467 | 12/1995 | Rugg | 364/491 |

*Primary Examiner*—Kevin J. Teska
*Assistant Examiner*—Jacques Louis-Jacques
*Attorney, Agent, or Firm*—Blakely, Sokoloff, Taylor & Zafman

[57] ABSTRACT

A logic synthesis method uses a two-dimensional sizing progression for selecting gates from a cell library in designing an integrated circuit. The drive load and desired performance for each logic gate in a functional configuration for the integrated circuit may be determined. The device configuration or gate to implement the logic gate may be selected from a cell library. The selected gate has a drive load range encompassing the determined drive load and achieves a desired performance target for the logic gate. A two-dimensional sizing progression may be used to help minimize layout area, power consumption, and performance loss in implementing BiNMOS gates.

30 Claims, 5 Drawing Sheets

| DRIVER | $C_{min}$ | $C_{max}$ | $T_{dmax}$ |
|--------|-----------|-----------|------------|
| A0 | 0 pF | 1 pF | 1 ns |
| B0 | 0 pF | 2 pF | 1 ns |
| C0 | 0 pF | 3 pF | 1 ns |
| D0 | 0 pF | 4 pF | 1 ns |

| DRIVER | $C_{min}$ | $C_{max}$ | $T_{dmax}$ |
|---|---|---|---|
| C1 | 1.5 pF | 3.0 pF | 1 ns |
| C2 | 1.5 pF | 3.0 pF | 0.6 ns |
| C3 | 1.5 pF | 3.0 pF | 0.4 ns |
| D1 | 2.0 pF | 4.0 pF | 1 ns |
| D2 | 2.0 pF | 4.0 pF | 0.6 ns |
| D3 | 2.0 pF | 4.0 pF | 0.4 ns |

*FIG. 6*

| DRIVER | $C_{min}$ | $C_{max}$ | $T_{dmax}$ |
|---|---|---|---|
| A0 | 0 pF | 1.0 pF | 1 ns |
| B0 | 0 pF | 2.0 pF | 1 ns |
| C0 | 0 pF | 3.0 pF | 1 ns |
| C1 | 1.5 pF | 3.0 pF | 1 ns |
| C2 | 1.5 pF | 3.0 pF | 0.6 ns |
| C3 | 1.5 pF | 3.0 pF | 0.4 ns |
| D0 | 0 pF | 4.0 pF | 1 ns |
| D1 | 2.0 pF | 4.0 pF | 1 ns |
| D2 | 2.0 pF | 4.0 pF | 0.6 ns |
| D3 | 2.0 pF | 4.0 pF | 0.4 ns |

*FIG. 8*

LOGIC SYNTHESIS HAVING TWO-DIMENSIONAL SIZING PROGRESSION FOR SELECTING GATES FROM CELL LIBRARIES

BACKGROUND OF THE INVENTION

1. Field of the Invention

The present invention relates generally to the field of integrated circuit design. More particularly, the present invention relates to the field of logic synthesis for integrated circuit design.

2. Description of the Related Art

Computer automated logic synthesis algorithms are typically used for the design of integrated circuits. For one logic synthesis algorithm, a software description for the logic of a desired integrated circuit is written and compiled to generate a representation of the functional configuration of logic gates for the integrated circuit. Specific device configurations are selected to implement logic gates in the representation. The desired integrated circuit may then be fabricated as the design for the integrated circuit is realized.

SUMMARY OF THE INVENTION

The present invention relates to a logic synthesis method which is utilized to design more robust integrated circuits through gate selection. The logic synthesis method is implemented by a data processing system for selecting a gate is described. A drive load and a desired performance for a logic gate to be implemented are determined. A group of gates having a drive load range encompassing the determined drive load is determined from a cell library. One of the gates from the determined group of gates is selected to implement the logic gate based on the desired performance for the logic gate.

A data processing system is also described. The data processing system includes memory for storing a cell library having a plurality of gates. The data processing system also includes first circuitry for determining a drive load and a desired performance for a logic gate to be implemented and second circuitry for determining from the cell library a group of gates having a drive load range encompassing the determined drive load. The data processing system further includes third circuitry for selecting one of the gates from the determined group of gates to implement the logic gate based on the desired performance for the logic gate.

Another data processing system is further described. The data processing system includes first means for storing a cell library having a plurality of gates. The data processing system also includes second means for determining a drive load and a desired performance for a logic gate to be implemented and third means for determining from the cell library a group of gates having a drive load range encompassing the determined drive load. The data processing system further includes fourth means for selecting one of the gates from the determined group of gates to implement the logic gate based on the desired performance for the logic gate.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 6 illustrates a table for selecting gates using a two-dimensional sizing progression;

FIG. 8 illustrates another table for selecting gates using a two-dimensional sizing progression.

DETAILED DESCRIPTION

The following detailed description sets forth an embodiment or embodiments in accordance with the present invention for logic synthesis having two-dimensional sizing progression for selecting gates from cell libraries. In the following description, details are set forth such as specific gates, drive load values, switching time delay values, etc., in order to provide a thorough understanding of the present invention. It will be evident, however, that the present invention may be practiced without these details. In other instances, well-known algorithms, devices, etc., have not been described in particular detail so as not to obscure the present invention.

Figure 1:
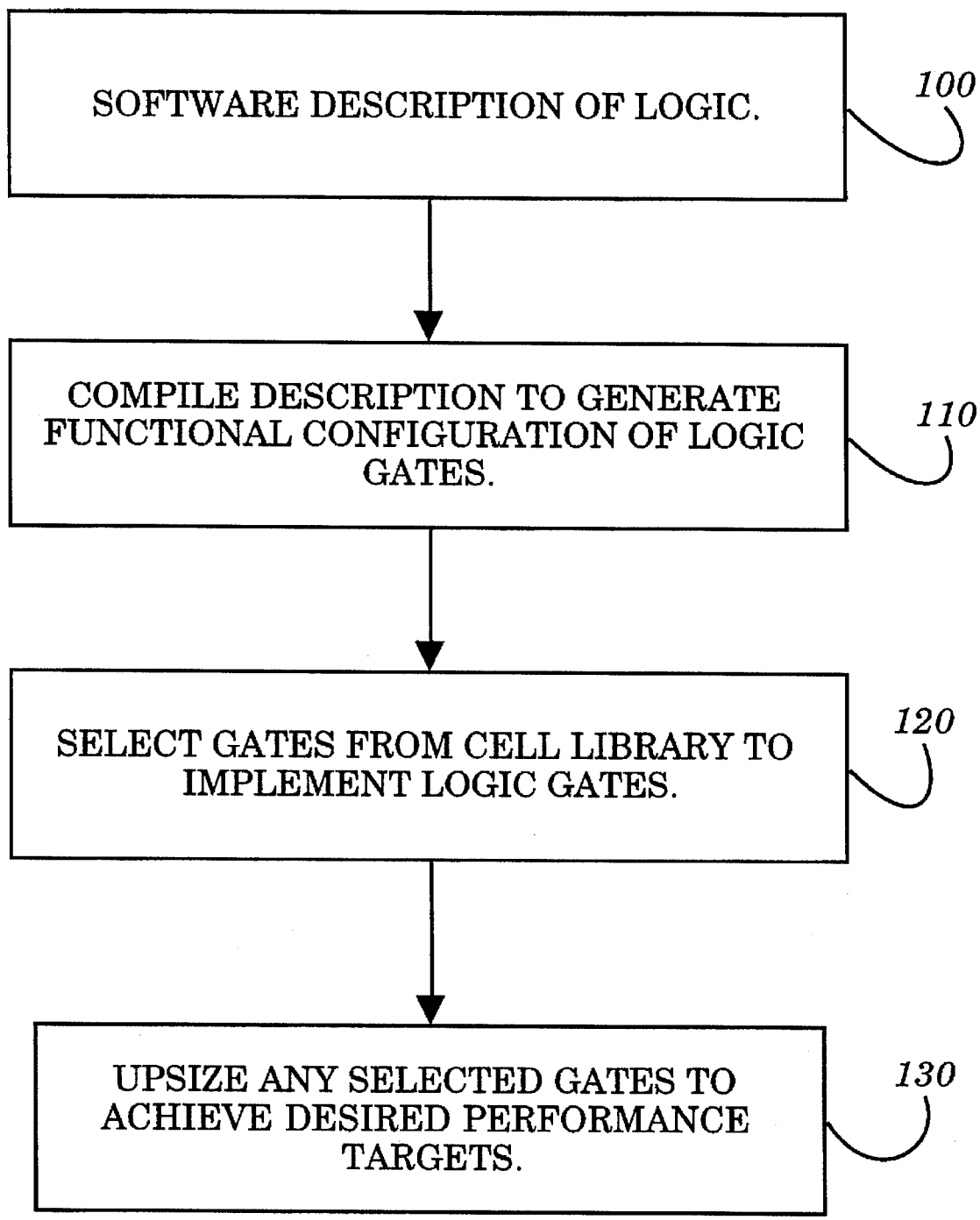
FIG. 1 illustrates, in flow diagram form, a logic synthesis method.

FIG. 1 illustrates, in flow diagram form, a logic synthesis method. The method of FIG. 1 may be used, for example, in designing a desired integrated circuit. The method or algorithm of FIG. 1 may be implemented by use of any suitable data processing system having any suitable circuitry for performing the method of FIG. 1. The method of FIG. 1 may be implemented using any suitable hardware, firmware, and/or software. As one example, a data processing system 200 as illustrated in FIG. 2 may be used to implement the method of FIG. 1.

Figure 2:
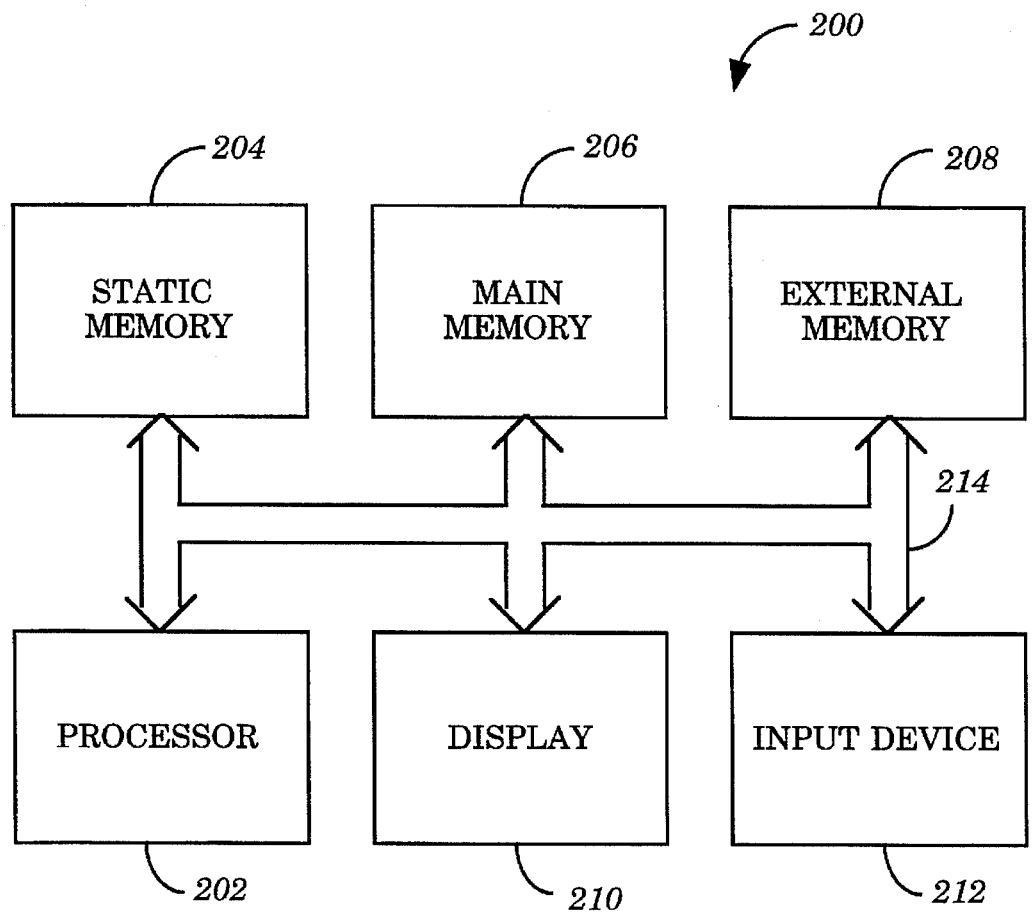
FIG. 2 illustrates a data processing system for implementing the method of FIG. 1.

As illustrated in FIG. 2, data processing system 200 includes a processor 202, a static memory 204, a main memory 206, an external memory 208, a display 210, a keyboard or other suitable input device 212, and a bus 214 coupling processor 202, static memory 204, main memory 206, external memory 208, display 210, and input device 212. Data processing system 200 may include other suitable hardware devices.

Processor 202 may include a microprocessor or any other suitable processing device, for example. Processor 202 may execute instructions stored in static memory 204, main memory 206, and/or external memory 208 for example. Processor 202 may process data stored in static memory 204, main memory 206, and/or external memory 208 for example. Processor 202 may include a single processing device or a plurality of processing devices.

Static memory 204 may include read only memory (ROM) or any other suitable memory device. Static memory 204 may store, for example, a boot program for execution by processor 202 to initialize data processing system 200. Main memory 206 may include random access memory (RAM) or any other suitable memory device. External memory 208 may include a hard disk device, a floppy disk, an optical disk device, a flash memory device, a file server device, or any other suitable memory device. For this detailed description, the term memory includes a single memory device and any combination of suitable memory devices for the storage of data and instructions, for example.

Bus 214 provides for the communication of digital information between hardware devices for data processing system 200. Processor 202 may receive over bus 214 information that is input by a user through input device 212. Processor 202 may output over bus 214 information that is to be displayed on display 210. Processor 202 may use bus 214 to transmit information to and to receive information from other hardware devices, including main memory 206 and external memory 208 for example.

For one embodiment the method of FIG. 1 may be implemented as a software algorithm executed by processor 202 of FIG. 2. The method of FIG. 1 may be performed by execution of a single program or of a plurality of programs by processor 202. The program or programs to implement the method of FIG. 1 may be stored in any suitable memory, including main memory 206 and/or external memory 208 for example, for execution by processor 202.

For step 100 of FIG. 1, a software description for the logic of a desired integrated circuit is written. Processor 202 may execute suitable editing or word processing software, for example, to allow a user to write and edit the logic software description by use of input device 212 and display 210. Any suitable software description or language may be used to describe the logic for the integrated circuit. The logic software description may include an arrangement of statements or instructions, for example, to describe the logic for the integrated circuit.

For step 110 of FIG. 1, the logic software description is compiled to generate a representation of a functional configuration of logic gates for the integrated circuit. Processor 202 may execute any suitable compiling software to compile the logic software description into a representation for the logic gate configuration. The compiler software used may depend, for example, on the language in which the logic description is written and on the representation of the logic gate configuration for the integrated circuit.

Figure 3:
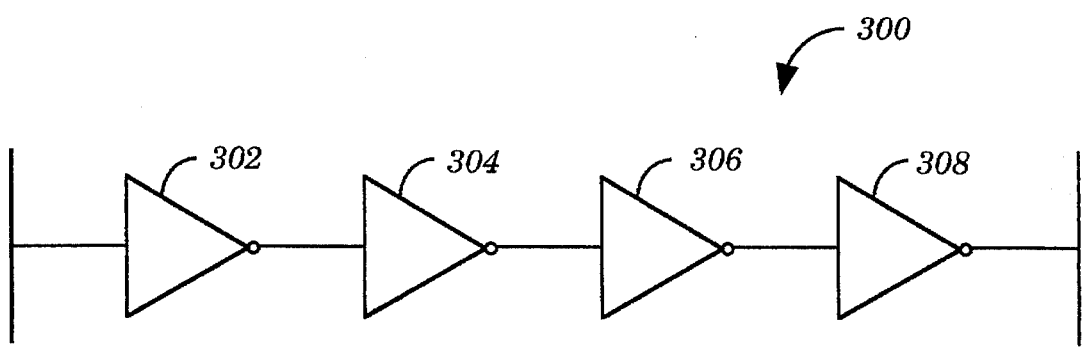
FIG. 3 illustrates a logic path of inverter gates.

The representation of the logic gate configuration may provide, for example, a configuration of AND, OR, NOT, NAND, NOR, and/or any other suitable gate or combination of gates to implement the integrated circuit. As one example, a logic gate representation may be generated to include a representation of a logic path 300 having inverter gates 302, 304, 306, and 308, as illustrated in FIG. 3. Logic path 300 is used to illustrate the method of FIG. 1. For logic path 300, the input terminals of inverter gates 304, 306, and 308 are coupled to the output terminals of inverter gates 302, 304, and 306, respectively. The input terminal of inverter gate 302 may be coupled to an output terminal of a preceding logic gate. The output terminal of inverter gate 308 may be coupled to the input terminal of a succeeding logic gate.

For steps 120 and 130 of FIG. 1, gate device configurations may be selected from a cell library to implement each logic gate in the representation generated for step 110 of FIG. 1. The cell library may contain, for example, different device configurations for each type of logic gate to be implemented. The cell library may include, for example, a single library of device configurations for gates that are to be implemented for the integrated circuit. The cell library may also include a plurality of libraries of various device configurations.

For one embodiment, the cell library may include different device configurations for implementing inverter gates. The cell library may include, for example, one or more inverter gates designed with Complementary Metal Oxide Semiconductor (CMOS) technology and one or more inverter gates designed with Bipolar n-channel Metal Oxide Semiconductor (BiNMOS) technology. The CMOS inverter gates in the cell library may have different-sized transistors and may be designed to handle different-sized loads, for example. The BiNMOS inverter gates in the cell library may also have different-sized transistors and may be designed to handle different-sized loads, for example. The cell library may also include various device configurations for implementing other gates, including AND, OR, NAND, NOR, and/or any other suitable gates or combinations of gates.

Processor 202 may execute any suitable software to select the device configurations for each logic gate in the representation generated for step 110 of FIG. 1. The cell library may be stored in any suitable memory, including main memory 206 and/or external memory 208 for example. Processor 202, in executing the software for steps 120 and 130 of FIG. 1, may select device configurations for each logic gate in the representation using one or more criteria such as drive load or a range of drive loads for the logic gate, drive load or a range of drive loads for any preceding logic gate, any timing constraints imposed on the logic gate, the speed or switching time delay with which the logic gate is to perform, and a desired output impedance for the logic gate for example.

In selecting device configurations for each logic gate using one or more criteria, processor 202 may use a software look-up table that stores an identification of gates available in the cell library along with one or more characteristics for the gates. For each gate identified in the look-up table, the look-up table may store, for example, a minimum drive load for the gate, a maximum drive load for the gate, a maximum switching time delay for the gate, and/or output impedance for the gate.

The look-up table may be stored in any suitable memory, including main memory 206 and/or external memory 208 for example, for access by processor 202. A single look-up table may be used for selecting gates from the cell library. A plurality of look-up tables may also be used for selecting gates from the cell library. A separate look-up table may be used for selecting any inverter gates, for example, from the cell library. A separate look-up table may be used for selecting any NAND gates, for example, from the cell library. Other suitable look-up tables may also be used for other families of gates. Processor 202 may use other suitable methods and data structures for selecting device configurations for each logic gate.

Processor 202 may use a linear or one-dimensional sizing progression to select device configurations from the cell library to implement logic gates for the integrated circuit. As one example, processor 202 may select from a cell library the device configuration for each inverter gate 302, 304, 306, and 308 of logic path 300 based on a maximum drive load for each inverter gate 302, 304, 306, and 308. Processor 202 may use a suitable look-up table having, for example, a maximum drive load for inverter gate device configurations available in the cell library.

Figures 4, 5:
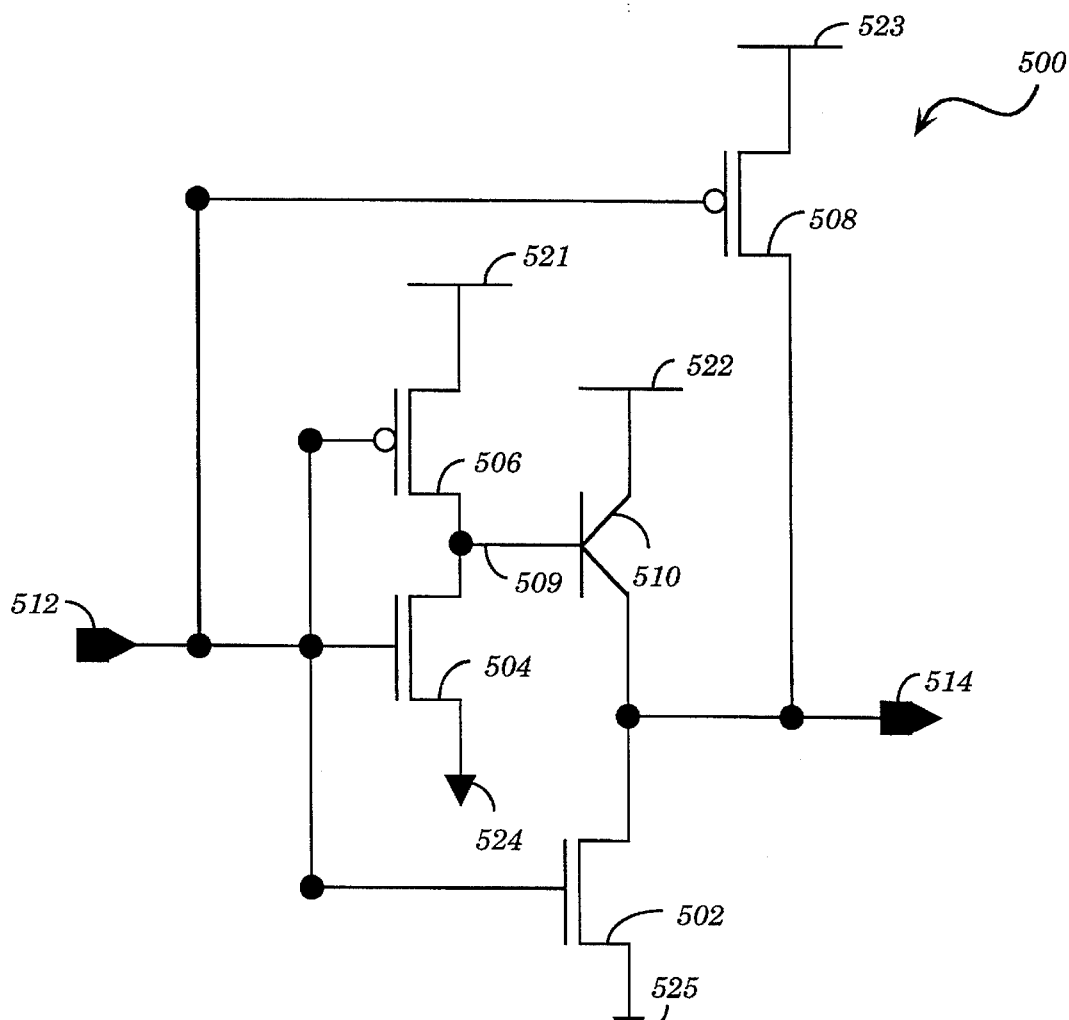
FIG. 4 illustrates a table for selecting gates using a linear or one-dimensional sizing progression.
FIG. 5 illustrates a device configuration for a BiNMOS inverter gate.

FIG. 4 illustrates a table 400 for selecting gates from a cell library using a linear or one-dimensional sizing progression. Table 400 includes inverter gates A0, B0, C0, and D0. Gates A0, B0, C0, and D0 are gates available in the cell library and may be designed with CMOS technology, for example. The cell library may include other suitable inverter gates. The gates of the cell library may be designed such that a first gate, or gate A0 for example, drives the smallest load and subsequent gates, or gates B0, C0, and D0 for example, drives a load larger than a previous gate. Each gate in the cell library may be designed such that the gate may drive a load that is smaller than the gate's maximum drive load, allowing for speed or performance improvement. The gates in the cell library may be designed, for example, with suitable transistor widths to obtain a desired maximum drive load and maximum switching time delay.

As illustrated in table 400 of FIG. 4, the minimum drive load for each gate A0, B0, C0, and D0 is, for example, approximately zero (0) picoFarads (pF). The maximum drive load for gates A0, B0, C0, and D0 is, for example, approximately one (1) pF, 2 pF, 3 pF, and 4 pF, respectively. The maximum switching time delay for each gate A0, B0, C0, and D0 is, for example, approximately one (1) nanosecond (ns). Other suitable drive load and switching time delay values may also be used for gates A0, B0, C0, and D0.

For step 120 of FIG. 1, gates are selected from the cell library to implement the logic gates. To select gates from the cell library for each inverter gate 302, 304, 306, and 308, the drive load for each inverter gate 302, 304, 306, and 308 is determined. The smallest gate in the cell library that is capable of driving this determined load is then selected to implement that inverter gate. In selecting the smallest gate, a suitable look-up table identifying gates A0, B0, C0, and D0 with each gate's maximum drive load, for example, may be used. Although any relatively larger gate that is capable of driving this determined load may be selected, this smallest gate is preferable as the smallest gate presents a relatively smaller load to any preceding logic gate.

As one example, the drive load for inverter gate 308 may be determined to be approximately 1.4 pF. Gate B0 is then selected from the cell library to implement inverter gate 308 as gate B0, which has a maximum drive load of approximately 2 pF, is the smallest gate for driving this load. The drive load for inverter gate 306 may then be determined, for example based on the load presented by inverter gate 308, and a suitable gate may then be selected from the cell library to implement inverter gate 306 based on this determined load. In a similar manner, suitable gates may also be selected from the cell library to implement inverter gates 304 and 302.

For step 130 of FIG. 1, any selected gates may be upsized to achieve desired performance targets. As a suitable gate has been selected from the cell library to implement each inverter gate 302, 304, 306, and 308 in the above example, the selected gates may then be upsized, for example in an iterative manner, to meet timing constraints and achieve desired performance targets for each inverter gate 302, 304, 306, and 308 or for logic path 300 as a whole.

For the example described above, gate B0 has been selected to implement inverter gate 308 for step 120 of FIG. 1. This gate may be upsized with gate C0 or gate D0, for example, to meet timing constraints imposed on inverter gate 308 or imposed on logic path 300, for example.

Other suitable gates, including AND, OR, NAND, and NOR gates for example, may also be selected using a one-dimensional sizing progression to implement logic gates in the representation generated for step 110 of FIG. 1. Because performance as a function of drive load for a CMOS gate is a substantially linear relationship, CMOS gates conform relatively well with the above linear or one-dimensional sizing progression. In selecting gates designed with BiNMOS technology, however, the one-dimensional sizing progression described above may limit the performance of and minimal layout area for selected gates and/or the logic path in which the selected gates are configured.

FIG. 5 illustrates a device configuration for a BiNMOS inverter gate 500. BiNMOS inverter gate 500 includes n-channel transistors 502 and 504, p-channel transistors 506 and 508, bipolar transistor 510, and voltage terminals 521, 522, 523, 524, and 525. BiNMOS inverter gate 500 receives a digital signal on an input node 512 and outputs the logical inversion of that digital signal on an output node 514.

For inverter gate 500, the voltage level for voltage terminals 521, 522, and 523 represents a high or logical-one voltage level. Any suitable voltage level may be used to represent this high or logical-one voltage level. The voltage level for voltage terminals 524 and 525 represents a low or logical-zero voltage level. Any suitable voltage level may be used to represent this low or logical-zero voltage level.

The source, gate, and drain of n-channel transistor 502 are coupled to voltage terminal 525, input node 512, and output node 514, respectively. In response to a high signal on input node 512, n-channel transistor 502 couples output node 514 to voltage terminal 525, pulling output node 514 low.

The source, gate, and drain of n-channel transistor 504 are coupled to voltage terminal 524, input node 512, and the drain of p-channel transistor 506 at node 509, respectively. In response to a high signal on input node 512, n-channel transistor 504 couples node 509 to voltage terminal 524, pulling node 509 low.

The source, gate, and drain of p-channel transistor 506 are coupled to voltage terminal 521, input node 512, and node 509, respectively. In response to a low signal on input node 512, p-channel transistor 506 couples node 509 to voltage terminal 521, pulling node 509 high.

The source, gate, and drain of p-channel transistor 508 are coupled to voltage terminal 523, input node 512, and output node 514, respectively. In response to a low signal on input node 512, p-channel transistor 508 couples output node 514 to voltage terminal 523, pulling output node 514 high.

The base, collector, and emitter of bipolar transistor 510 are coupled to node 509, voltage terminal 522, and output node 514, respectively. In response to a high signal on node 509, bipolar transistor 510 couples output node 514 to voltage terminal 522, pulling output node 514 high.

In response to a high signal on input node 512, n-channel transistor 502 pulls output node 514 low. The high signal on input node 512 also causes n-channel transistor 504 to pull node 509 low, grounding the base of bipolar transistor 510. In response to a low signal on input node 512, p-channel transistor 506 pulls node 509 high, driving the base of bipolar transistor 510 and thus coupling output node 514 to voltage terminal 522. The low signal on input node 512 also causes p-channel transistor 508 to pull output node 514 to voltage terminal 523. P-channel transistor 508 provides for an output restore for inverter gate 500. As output node 514 may not be completely pulled-up to the voltage level at voltage terminal 522 by bipolar transistor 510, p-channel transistor 508 helps to complete a low-to-high transition on output node 514 by pulling output node 514 to voltage terminal 523.

Use of the above one-dimensional sizing progression imposes a mutually exclusive sizing requirement for BiNMOS inverter gate 500 as a BiNMOS gate selected from the cell library using a one-dimensional sizing progression is to be designed to handle relatively large as well as relatively small loads.

The size of n-channel transistor 502 determines the switching time delay for a high-to-low transition on output node 514. This pull-down switching time delay as a function of load is a substantially linear relationship. In driving relatively small loads, n-channel transistor 502 pulls-down output node 514 relatively rapidly for a high-to-low transition on output node 514. To minimize any impact from bipolar transistor 510 for this high-to-low transition on output node 514, n-channel transistor 504 should be relatively large while the ratio of the size of p-channel transistor 506 to the size of n-channel transistor 504 should be relatively small so that the base of bipolar transistor 510 is also pulled-down relatively rapidly. The sizes of n-channel transistor 504 and p-channel transistor 506, however, also determine the switching time delay for a low-to-high transition on output node 514. To handle relatively large loads for a low-to-high transition on output node 514, p-channel transistor 506 should be relatively large while the ratio of the size of p-channel transistor 506 to the size of n-channel transistor 504 should be relatively large.

As BiNMOS inverter gate 500 is to be designed to handle both relatively large loads and relatively small loads, the sizing requirements for n-channel transistor 504 and p-channel transistor 506 have competing concerns, resulting in BiNMOS inverter gate 500 having an unnecessarily large n-channel transistor 504 when selected to handle relatively large loads and having an unnecessarily large p-channel transistor 506 when selected to handle relatively small loads. As p-channel transistor 508 is to be sized to handle relatively large drive loads for inverter gate 500 in pulling-up output node 514, BiNMOS inverter gate 500 may also have an unnecessarily large p-channel transistor 508 when selected to handle relatively small loads.

Any increased size for n-channel transistor 504 and for p-channel transistors 506 and 508 translates into increased layout area, power consumption, and speed or performance loss for BiNMOS inverter gate 500. Any increased size for transistors 504, 506, and 508 also translates into an increased load on input node 512 for BiNMOS inverter gate 500. In driving approximately the same amount of output load, a BiNMOS gate selected using a one-dimensional sizing progression may thus present a relatively larger load to any preceding logic gate in a logic path as compared to a BiNMOS gate designed to drive a single load or a relatively reduced range of loads. As the logic path becomes intrinsically slower as a result of such increased loading, the gates in the logic path may be subjected to demanding timing constraints, possibly requiring rework or logic restructuring for the logic path. A one-dimensional sizing progression imposes similar mutually exclusive sizing requirements for other types of gates, including AND, OR, NOR, and NAND gates for example, designed with BiNMOS technology.

To help minimize layout area, power consumption, and performance loss in implementing BiNMOS gates, processor 202 may use a two-dimensional sizing progression to select gates from a cell library to implement logic gates for a desired integrated circuit. As one example, processor 202 may select from the cell library the device configuration for each inverter gate 302, 304, 306, and 308 of logic path 300 based on the drive load for each inverter gate 302, 304, 306, and 308 and based on the desired performance for each inverter gate 302, 304, 306, and 308. Gates available in the cell library may be designed to handle relatively reduced drive load ranges with varying performance capabilities. To select gates from this cell library, processor 202 may use a suitable look-up table having, for example, a minimum drive load and a maximum drive load for inverter gate device configurations available in the cell library.

FIG. 6 illustrates a table 600 for selecting gates from a cell library using a two-dimensional sizing progression. Table 600 includes inverter gates C1, C2, C3, D1, D2, and D3. Gates C1, C2, C3, D1, D2, and D3 are gates available in the cell library and may be designed with BiNMOS technology, for example. Gates C1, C2, and C3 are gates from the same set of gates. Gates D1, D2, and D3 are gates from another set of gates. The cell library may include other suitable sets of inverter gates.

Each gate in the same set of gates may have approximately the same drive load range. The drive load range is determined by a minimum drive load and a maximum drive load for each gate. For each drive load range, and hence for each set of gates, a plurality of gates with a relatively increased drive may be available from the cell library. The gates for the cell library may be designed, for example, with suitable transistor sizes to obtain a desired minimum drive load, a desired maximum drive load, and a desired drive or switching time delay. Each set of gates for the cell library may be designed such that the drive load range for the set of gates overlaps the drive load range for another set of gates.

As illustrated in table 600 of FIG. 6, the minimum drive load for each gate C1, C2, and C3 is, for example, approximately 1.5 pF. The minimum drive load for each gate D1, D2, and D3 is, for example, approximately 2.0 pF. The maximum drive load for each gate C1, C2, and C3 is, for example, approximately 3.0 pF. The maximum drive load for each gate D1, D2, and D3 is, for example, approximately 4.0 pF. The maximum switching time delay for gates C1, C2, and C3 is, for example, approximately one (1) ns, 0.6 ns, and 0.4 ns, respectively. The maximum switching time delay for gates D1, D2, and D3 is, for example, approximately one (1) ns, 0.6 ns, and 0.4 ns, respectively. Other suitable load and switching time delay values may also be used for gates C1, C2, C3, D1, D2, and D3.

Figure 7:
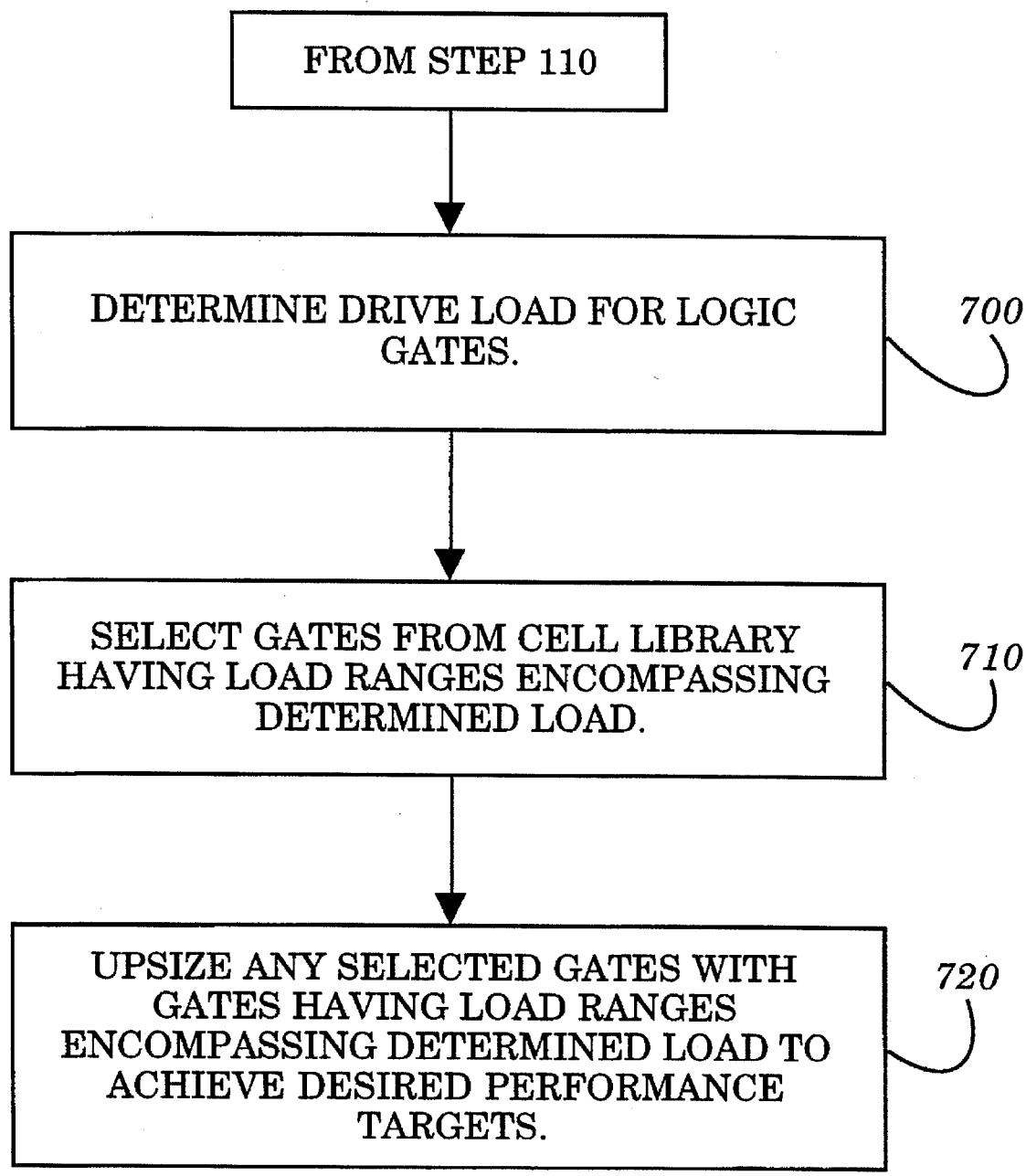
FIG. 7 illustrates, in flow diagram form, a method for selecting gates using a two-dimensional sizing progression.

FIG. 7 illustrates, in flow diagram form, a method for selecting gates from a cell library using a two-dimensional sizing progression. The method of FIG. 7 may be used to select gates from a cell library for step 120 of FIG. 1 and to upsize any selected gates for step 130 of FIG. 1. For the method of FIG. 7, processor 202 may execute any suitable software to select the device configurations for each logic gate in the representation generated for step 110 of FIG. 1.

For step 700 of FIG. 7, the drive load for the logic gates is determined. For logic path 300, the drive load for inverter gates 302, 304, 306, and 308 is determined.

For step 710 of FIG. 7, gates are selected from the cell library to implement the logic gates. For logic path 300, gates are selected from the cell library to implement inverter gates 302, 304, 306, and 308. Each gate is selected from gates in the cell library that have a drive load range encompassing the drive load determined for step 700 of FIG. 7. Of the gates with such a drive load range, the smallest gate may be selected. A suitable look-up table identifying gates available in the cell library, including gates C1, C2, C3, D1, D2, and D3 for example, with each gate's minimum drive load and maximum drive load, for example, may be used in selecting the smallest gate. The look-up table may be arranged such that the first gate for each set of gates is the smallest gate. The look-up table may also store for each gate one or more performance characteristics, including maximum switching time delay and/or output impedance for example, so that this smallest gate may be determined. Although any relatively larger gate having the desired drive load range may be selected, this smallest gate is preferable as the smallest gate presents a relatively smaller load to any preceding logic gate.

As one example, the drive load for inverter gate 308 may be determined to be approximately 1.8 pF. The gate to implement inverter gate 308 may be selected from the set of gates C1, C2, C3 as this set of gates has a drive load range encompassing 1.8 pF. Of this set of gates, gate C1 may be selected to implement inverter gate 308 as gate C1 is the smallest gate in the set and thus would present a relatively smaller load to inverter gate 306. The drive load for inverter gate 306 may then be determined, for example based on the load presented by the selected gate C1 for inverter gate 308, and a suitable gate from the cell library may be selected based on this load to implement inverter gate 306. In a similar manner, suitable gates may also be selected from the cell library to implement inverter gates 304 and 302.

For step 720 of FIG. 7, any of the selected gates may be upsized to achieve desired performance targets. The selected gates are preferably upsized with gates having a drive load range that encompasses the drive load determined for step 700 of FIG. 7 as the selection of gates having such a drive load range may help minimize layout area, performance loss, and power consumption. As a suitable gate has been selected from the cell library to implement each inverter gate 302, 304, 306, and 308, the selected gates may be upsized, for example in an iterative manner, to achieve desired performance targets for each inverter gate 302, 304, 306, and 308 or for logic path 300 as a whole.

In upsizing a selected gate, the performance of the selected gate may be simulated and tested, for example, to determine whether the selected gate achieves a desired performance target. The look-up table may also be used to make this determination. The look-up table may store, for example, one or more performance characteristics such as maximum switching time delay and/or output impedance for each gate to determine whether the selected gate achieves a desired performance target.

If the selected gate does not achieve the desired target performance, the selected gate may be upsized with a larger gate that preferably has a drive load range encompassing the drive load determined for step 700 of FIG. 7. The look-up table may be arranged such that any gate succeeding the selected gate in the look-up table is a larger gate. The look-up table may also store for each gate one or more performance characteristics, including maximum switching time delay and/or output impedance for example, so that a larger gate may be selected. Selected gates may be upsized until a gate has been selected that achieves a desired performance target.

For the example described above, gate C1 has been selected to implement inverter gate 308 for step 710 of FIG. 7. The selected gate may be upsized with gate C2 or C3, for example, as gates C2 and C3 also have a drive load range that encompasses the determined drive load for inverter gate 308. The selected gate may be upsized, for example, to meet timing constraints imposed on inverter gate 308 or imposed on logic path 300.

For another example, the drive load for inverter gate 308 may be determined to be approximately 2.4 pF. Gate C1, C2, C3, D1, D2, or D3 may thus be selected as these gates have a drive load range encompassing 2.4 pF. The smallest of these gates, gate C1, may be initially selected to implement inverter gate 308. This gate may then be upsized with gate C2, C3, D1, D2, or D3, for example, to achieve a desired performance target for inverter gate 308 or for logic path 300.

The logic gates for the representation of the logic gate configuration may be analyzed in any suitable order or according to any suitable algorithm in selecting and upsizing device configurations to implement each logic gate. As described above, device configurations for inverter gates 302, 304, 306, and 308 may be selected starting with the last gate in logic path 300, inverter gate 308, while working backwards along logic path 300, selecting gates for inverter gate 306, inverter gate 304, and then inverter gate 302. Each inverter gate 302, 304, 306, and 308 may be analyzed in a different order in selecting and upsizing device configurations.

Other suitable gates, including AND, OR, NAND, and NOR gates for example, may also be selected using a two-dimensional sizing progression to implement logic gates in the representation generated for step 110 of FIG. 1. As compared to the use of a linear or one-dimensional sizing progression in selecting gates, BiNMOS gates may be designed for and selected using a two-dimensional sizing progression to drive approximately the same load while presenting a minimized load to any preceding logic gate. The BiNMOS gate thus selected may also drive approximately the same load with a relatively increased drive. The layout area, power consumption, and performance loss for selected BiNMOS gates may thus be minimized in using a two-dimensional sizing progression.

A two-dimensional sizing progression may be used for gates designed with BiNMOS as well as for gates designed with other suitable technologies, including CMOS and BiCMOS technologies for example. As illustrated in table 800 of FIG. 8, gates A0, B0, C0, and D0 from table 400 of FIG. 4 and gates C1, C2, C3, D1, D2, and D3 from table 600 of FIG. 6 may be combined for selection from the same cell library using a two-dimensional sizing progression. Gates A0, B0, C0, and D0 may be CMOS gates, for example, while gates C1, C2, C3, D1, D2, and D3 may be BiNMOS gates, for example. As gates A0, B0, C0, and D0 have been designed to handle smaller loads to allow for speed for performance improvement in selecting gates using a one-dimensional sizing progression, the minimum drive load for gates A0, B0, C0, and D0 is approximately zero (0) pF in determining each gate's drive load range for use with a two-dimensional sizing progression.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A logic synthesis method having two-dimensional sizing progression for selecting a logic gate to be implemented within a circuit, comprising the steps of:

(a) determining a drive load and a desired performance for the logic gate;

(b) determining a group of gates restricted to a drive load range encompassing the determined drive load from a cell library by utilizing a look-up table that contains at least a minimum drive load and a maximum drive load corresponding to each gate of said group of gates; and (c) selecting one gate from the group of gates to be used as the logic gate.

2. The method of claim 1, wherein the group of gates from the cell library include BiNMOS gates.

3. The method of claim 1, wherein the group of gates from the cell library include CMOS gates.

4. The method of claim 1, wherein the selecting step is based on the desired performance for the logic gate.

5. A logic synthesis method having two-dimensional sizing progression for selecting a logic gate to be implemented within a circuit, comprising the steps of:

(a) determining a drive load and a desired performance for the logic gate;

(b) determining a group of gates restricted to a drive load range encompassing the determined drive load from a cell library, said drive load range being defined by a minimum drive load and a maximum drive load; and (c) selecting one gate from the group of gates to be used as the logic gate, wherein said selecting step includes (i) selecting one of the gates from the group of gates that is a smallest gate in physical size in the group of gates, and (ii) replacing the one gate selected in the selecting step (c)(i) with another gate from the group of gates based on the desired performance for the logic gate, the another gate being larger in physical size than the one gate selected in step (c)(i).

6. The method of claim 5, wherein the group of gates for the cell library include BiNMOS gates.

7. The method of claim 5, wherein the group of gates from the cell library include CMOS gates.

8. The method according to claim 5, wherein the selecting step is based on the desired performance for the logic gate.

9. A logic synthesis method having two-dimensional sizing progression for selecting a logic gate to be implemented within a circuit, comprising the steps of:

(a) determining a drive load and a desired performance for the logic gate to be implemented;

(b) determining a group of gates restricted to a drive load range encompassing the determined drive load from a cell library that includes a plurality of sets of gates, each gate in one set of gates of the plurality of sets of gates is included in the group of gates and has a drive load range that encompasses the drive load and is approximately the same as the drive load range for any other gate in the one set of gates; and (c) selecting one gate from the group of gates to be used as the logic gate based on the desired performance for the logic gate.

10. The method of claim 9, wherein for the determining step, the drive load range for each gate in the one set of gates overlaps a drive load range for each gate in another set of the plurality of sets of gates.

11. The method of claim 9, wherein each gate in the one set of gates has a different switching time delay.

12. The method of claim 11, wherein the selecting step (c) includes the steps of:

(i) selecting one of the gates from the one set of gates, and (ii) replacing the one gate selected in the selecting step (c)(i) with another gate from the one set of gates based on the desired performance for the logic gate, the another gate is physically larger in size than the one gate.

13. The method of claim 9, wherein the group of gates for the cell library include one of BiNMOS and CMOS gates.

14. A system to design a circuit comprising:

(a) memory which contains a cell library having a plurality of gates and a lookup table that identifies the plurality, of gates in the cell library, the look-up table further contains a minimum drive load and a maximum drive load for each of the plurality of gates;

(b) first circuitry that determines a drive load and a desired performance for a logic gate to be implemented within the circuit;

(c) second circuitry that determines from the look-up table of the cell library a group of gates restricted to a drive load range encompassing the drive load; and (d) third circuitry that selects one gate from the group of gates to be used as the logic gate.

15. The system of claim 14, wherein the group of gates from the cell library include BiNMOS gates.

16. The system of claim 14, wherein the group of gates from the cell library include CMOS gates.

17. A system to design a circuit comprising:

(a) memory which contains a cell library having a plurality of gates;

(b) first circuitry that determines a drive load and a desired performance for a logic gate to be implemented within the circuit;

(c) second circuitry that determines from the cell library a group of gates restricted to a drive load range encompassing the drive load, said drive load range being defined by a minimum drive load and a maximum drive load; and (d) third circuitry that selects one gate from the group of gates to be used as the logic gate.

18. The method according to claim 17, wherein the third circuitry selects said one gate based on the desired performance for the logic gate.

19. A system to design a circuit comprising:

(a) memory which contains a cell library having a plurality of sets of gates, each gate in one set of gates of the plurality of sets of gates having a drive load range that encompasses the drive load and is approximately the same as the drive load range for any other gate in the one set of gates;

(b) first circuitry that determines a drive load and a desired performance for a logic gate to be implemented within the circuit;

(c) second circuitry that determines from the cell library a group of gates restricted to a drive load range encompassing the drive load, said drive load range being defined by a minimum drive load and a maximum drive load; and (d) third circuitry that selects one gate from the group of gates to be used as the logic gate based on the desired performance for the logic gate.

20. The system of claim 19, wherein the drive load range for each gate in the one set of gates overlaps a drive load range for each gate in another set of the plurality of sets of gates.

21. The system of claim 19, wherein each gate in the one set of gates has a different switching time delay.

22. A system to design a circuit comprising:

(a) first means for storing a cell library having a plurality of gates and a look-up table that identifies the plurality of gates in the cell library and that contains a minimum drive load and a maximum drive load for each of the plurality of gates;

(b) second means for determining a drive load and a desired performance for a logic gate to be implemented within the circuit;

(c) third means for determining from the look-up table of the cell library a group of gates restricted to a drive load range encompassing the drive load; and (d) fourth means for selecting one gate from the group of gates to used as the logic gate based on the desired performance for the logic gate.

23. The system of claim 22, wherein the group of gates from the cell library include BiNMOS gates.

24. The system of claim 22, wherein the group of gates from the cell library include CMOS gates.

25. A system to design a circuit comprising: system
   (a) first means for storing a cell library having a plurality of gates;
   (b) second means for determining a drive load and a desired performance for a logic gate to be implemented within the circuit;
   (c) third means for determining from the cell library a group of gates restricted to a drive load range encompassing the drive load, said drive load range being defined by a minimum drive load and a maximum drive load; and
   (d) fourth means for selecting one gate from the group of gates to be used as the logic gate based on the desired performance for the logic gate.

26. The method according to claim 25, wherein the fourth means selects said one gate based on the desired performance for the logic gate.

27. A system to design a circuit comprising:
   (a) first means for storing a cell library having a plurality of sets of gates, each gate in one set of gates of the plurality of sets of gates having a drive load range that encompasses the drive load and is approximately the same as the drive load range for any other gate in the one set of gates; and
   (b) second means for determining a drive load and a desired performance for a logic gate to be implemented;
   (c) third means for determining from the cell library a group of gates restricted to a drive load range encompassing the drive load, said drive load range being defined by a minimum drive load and a maximum drive load; and
   (d) fourth means for selecting one gate from the group of gates to be used as the logic gate.

28. The system of claim 27, wherein the drive load range for each gate in the one set of gates overlaps a drive load range for each gate in another set of the plurality of sets of gates.

29. The system of claim 27, wherein each gate in the one set of gates has a different switching time delay.

30. A logic synthesis method having two-dimensional sizing progression for selecting a logic gate to be implemented within a circuit, comprising the steps of:
   (a) determining a switching time delay and a desired drive load for the logic gate;
   (b) determining a group of gates, restricted to a switching time delay range encompassing the determined switching time delay, from a cell library by utilizing a look-up table that contains at least a minimum switching time delay and a maximum switching time delay corresponding to each gate of said group of gates; and
   (c) selecting one gate from the group of gates to be used as the logic gate based on satisfying the desired drive load.

* * * * *